United States Patent
Bharatan et al.

(10) Patent No.: US 9,718,671 B2
(45) Date of Patent: Aug. 1, 2017

(54) MEMS ACOUSTIC SENSOR COMPRISING A NON-PERIMETER FLEXIBLE MEMBER

(71) Applicant: INVENSENSE, INC., San Jose, CA (US)

(72) Inventors: Sushil Bharatan, Burlington, MA (US); Baris Cagdaser, Sunnyvale, CA (US)

(73) Assignee: INVENSENSE, INC., San Jose, CA (US)

( * ) Notice: Subject to any disclaimer, the term of this patent is extended or adjusted under 35 U.S.C. 154(b) by 84 days.

(21) Appl. No.: 14/642,693

(22) Filed: Mar. 9, 2015

(65) Prior Publication Data
US 2016/0264398 A1 Sep. 15, 2016

(51) Int. Cl.
*G01L 9/00* (2006.01)
*B81B 3/00* (2006.01)
*B81C 1/00* (2006.01)

(52) U.S. Cl.
CPC .......... *B81B 3/007* (2013.01); *B81C 1/00658* (2013.01); *G01L 9/003* (2013.01); *G01L 9/0072* (2013.01); *G01L 9/0095* (2013.01); *B81B 2203/0127* (2013.01); *B81B 2203/0163* (2013.01)

(58) Field of Classification Search
None
See application file for complete search history.

(56) References Cited

U.S. PATENT DOCUMENTS

| | | | |
|---|---|---|---|
| 2010/0278372 A1* | 11/2010 | Zhang | H04R 1/222 381/412 |
| 2011/0274298 A1* | 11/2011 | Yang | H04R 19/016 381/174 |
| 2012/0027235 A1 | 2/2012 | Chan et al. | |
| 2013/0177180 A1* | 7/2013 | Bharatan | H04R 1/08 381/174 |
| 2015/0146906 A1* | 5/2015 | Je | H04R 7/02 381/369 |
| 2016/0353210 A1* | 12/2016 | Schmid | H04R 19/04 |

* cited by examiner

*Primary Examiner* — Andre Allen
(74) *Attorney, Agent, or Firm* — Amin, Turocy & Watson, LLP

(57) ABSTRACT

A micro electro-mechanical system (MEMS) acoustic sensor is disclosed. The acoustic sensor comprises a backplate and a diaphragm. The acoustic sensor further comprises a flexible member and optional spacer member disposed between the backplate and the diaphragm resulting in a gap between the backplate and the diaphragm. The gap can vary in response to impinging pressure on the diaphragm based on the design of the flexible member and resulting in a variable capacitance between the backplate and the diaphragm. The change in the gap can result in a change in an electrical characteristic associated with the variable capacitance and can be converted to an electrical output signal corresponding to the impinging pressure on the diaphragm. The flexible member can be part of the backplate or diaphragm.

20 Claims, 10 Drawing Sheets

MEMS ACOUSTIC SENSOR COMPRISING A NON-PERIMETER FLEXIBLE MEMBER

TECHNICAL FIELD

Embodiments of the subject disclosure relate generally to a micro electro-mechanical system (MEMS) acoustic sensor, and particularly to a spring based or flexible member based MEMS acoustic sensor.

BACKGROUND

By way of brief background, an acoustic sensor in conventional capacitive microphone technology generally disposes a spring at the periphery of a diaphragm. This can result in coupling the spring stiffness to the diaphragm design parameters. Further, this can result in issues associated with modularity of the acoustic sensor that can impose restrictions on forming arrays of acoustic sensors having perimeter springs coupled to the diaphragm. Additionally, in some conventional acoustic sensor designs employing perimeter springs coupled to the diaphragm, the displacement of the diaphragm can deviate sufficiently from a flat displacement to be associated with a decrease in microphone sensitivity.

DETAILED DESCRIPTION

Figure 1:
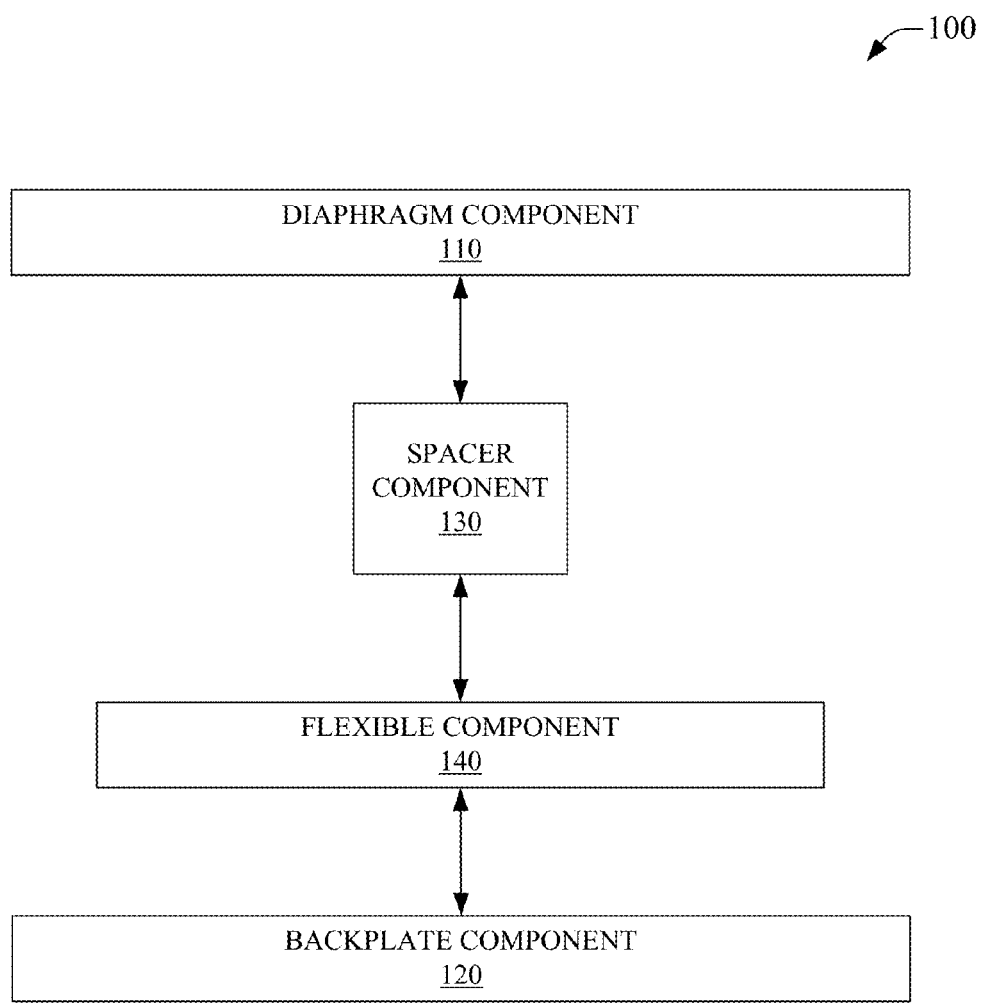
FIG. 1 is a non-limiting example illustration of a system that enables an acoustic sensor having a non-perimeter flexible member in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Conventional spring based acoustic sensors generally have springs located at the periphery of the diaphragm. This can be associated with coupling the spring characteristics to the diaphragm parameters. Further, this can result in issues associated with modularity of the microphone and/or acoustic sensor that can impose restrictions on forming arrays of microphones and/or acoustic sensors that have perimeter springs coupled to the diaphragm. Additionally, in some conventional acoustic sensor designs employing perimeter springs coupled to the diaphragm, the displacement of the diaphragm can deviate sufficiently from a flat displacement, which can be associated with a decrease in microphone sensitivity.

An acoustic sensor can be a device that converts sound pressure from acoustic waves received at the acoustic sensor to electrical signals. Acoustic sensors can be used in numerous different applications including, but not limited to, cellular phone, mobile devices, tablet computers, laptop computers, hearing aids, voice recordation systems, speech recognition systems, audio recording and engineering, public and private amplification systems and the like.

MEMS acoustic sensors can have numerous advantages including low power consumption and high performance. Additionally, a MEMS acoustic sensor can be available in a small package and can facilitate use in a wide variety of applications that require a device with a small footprint. A MEMS acoustic sensor can typically function as a capacitive device that includes a pressure-sensitive diaphragm that vibrates in response to sound pressure resultant from an acoustic wave incident on the diaphragm. An acoustic sensor can be fabricated employing semiconductor wafers, typically silicon, in highly automated production processes that can deposit layers of different materials on the silicon wafer and then employ curing and etching processes to form the diaphragm and a backplate. Generally, air can move through the back plate to better allow the diaphragm to respond with reduced interference associated with compression of air between the diaphragm and a non-vented backplate. The diaphragm can then generally deflect in response more purely to the sound pressure associated with sound waves propagating through the air. The sensed phenomenon, e.g., acoustic pressure, is converted into an electrical signal. The electrical signal can be processed by a circuit, such as an application specific integrated circuit, e.g., ASIC, for performing any number of functions associated with a MEMS microphone.

In accordance with an example embodiment of a MEMS acoustic sensor of the present disclosure, flexible members, e.g., springs, deformable structures, elastic compounds, etc., can be connected between a diaphragm and a backplate such that the flexible members are not located substantially at the periphery of the diaphragm. This can alleviate problems associated with conventional designs. In an aspect, the flexible member can be part of the backplate. The flexible member can account for part, or all of a gap between a diaphragm and the backplate. Whereas the flexible member can flex, stretch, etc., this can allow displacement of the diaphragm relative to the backplate and can cause the diaphragm and the backplate to act as a variable capacitor as a function of the gap between the diaphragm and the backplate. Where audio pressure impinges on the diaphragm, this pressure can result in deformation of the flexible members to cause the gap between the diaphragm and the backplate to change in response to the audio pressure. This change in gap can affect the electrical characteristics of the variable capacitor embodying the diaphragm, backplate, and flexible members. These electrical characteristics can be measured and converted into a useful electrical signal. As an example, where a sound pressure impinges on the diaphragm, the gap between the diaphragm and the backplate can change, this can result in a change in capacitance that can be measured and converted into an electrical signal corresponding to the impinging sound pressure.

In an embodiment of the instant disclosure, a spacer member can connected to the flexible member to adjust the gap between the diaphragm and the backplate. In an aspect, the backplate can comprise a flexible member connected to a spacer member which can be connected to the diaphragm. In another aspect, the backplate can be connected to a spacer member, or can comprise a spacer member, which can be connected to a flexible member that can be connected to the diaphragm. In other aspects of the instant disclosure, other spacer member and flexible member configurations can be employed, such as, backplate to spacer member to flexible member to spacer member to diaphragm, etc. Moreover, in some embodiments, the flexible member can be planar with the backplate or diaphragm, while in other embodiments, the flexible member can be out of plane from the backplate or the diaphragm. It will be noted that where the flexible member is out of plane with the backplate or diaphragm, the height or a spacer can be different from a length associated with an in plane flexible member and yet achieve the same, or similar, gap distance between the backplate and diaphragm. Of further note, in some embodiments, where the flexible member is out of plane from the diaphragm or backplate, the flexible member can define the gap between the backplate and diaphragm without a spacer member.

In an aspect, the inclusion of the flexible member in the design of the backplate or diaphragm can allow the flexible member to be moved inward from the periphery of the diaphragm of conventional Microelectromechanical Systems (MEMS) acoustic sensors. MEMS can refer to a class of devices, or components thereof, fabricated using semiconductor-like processes and often exhibiting mechanical characteristics such as the ability to move or deform. Inclusion of the flexible member in the backplate or diaphragm can indicate that the flexible member is integral to, part of, or is comprised in, the backplate or diaphragm respectively as compared to the flexible member being a distinct or separate component mated to the backplate or diaphragm respectively. As an example, where the backplate is formed of deposited polysilicon, the flexible member can be co-formed, at least in part, in deposited polysilicon, such that the backplate and flexible member can be said to be integral to each other. Thereafter, portions of the backplate can be altered to provide different electrical or mechanical properties from the flexible member without loss of the backplate comprising the flexible member, e.g., the backplate can be doped to have a different electrical characteristic than the flexible member, for example, the backplate can be more conductive than the flexible member, etc. As another example, the backplate can be metalized while the co-formed flexible member is shielded from metallization. As a further example, the flexible member can be doped to have a different electrical characteristic than the backplate, for example, the flexible member can be more conductive than the backplate, etc. Additionally, other differences can be designed into a backplate comprising a flexible member, for example, the backplate can comprise stiffening structures that are absent in a co-formed flexible member. It will be noted that these aspects similarly apply to diaphragm comprising a flexible member. In some embodiments, the flexible member can be formed separate from the backplate or diaphragm and then be connected to the backplate or diaphragm respectively.

Of note, the term "between" with respect to disclosing that a first component may be disposed between two other components can refer to linearly and/or logically disposing the first component between the other two components. As such, for example, a spacer member can be disposed either linearly or logically between two other components. By linearly disposing of the spacer member between two other components, it is meant that traversing a straight line drawn through the three components results in passing a first member, then the spacer member, then the other member. In an analogy, linear disposition can be likened to a jelly sandwich that can have the jelly disposed between the two slices of bread. What is meant by logically disposing of the spacer between the other two members is that a path leads through the members in an order having the spacer member between the other two members even where the traversal may not follow a straight line. As an example, where two pieces of bread rest on top of a layer of jelly smeared on a dinner plate, a path can be logically formed that passes from top to bottom through the first piece of bread an into the layer of jelly, then traverses through the jelly from left to right before passing from bottom to top to pass through the second piece of bread. As such, even though there is no jelly between the pieces of bread in the plane of the two pieces of bread, the jelly can still be considered logically between the layers of bread by following a path that leaves and then reenters the plane of the pieces of bread. Similarly, for example, where a flexible member is co-planar with a backplate, the flexible member can still be considered "between" the backplate and the diaphragm because a path can be traversed from the backplate coplanar through the flexible member before passing out of the flexible member plane to traverse the diaphragm. This can be seen in FIG. 3, where a path from backplate 320 can traverse laterally through flexible member 340 (note that flexible member 340 is illustrated slightly elevated above backplate 320 for clarity) before moving perpendicular to backplate 320 to traverse spacer member 330 and diaphragm 310. As such, in FIG. 3, both flexible member 340 and spacer member 330 can be considered to be "between" backplate 320 and diaphragm 310.

In some embodiments of the presently disclosed subject matter, disposing of a flexible member and/or a spacer member between a backplate and diaphragm as part of an acoustic sensor can facilitate arraying more than one acoustic sensor on a substrate. As an example, where the flexible member is between the diaphragm and the backplate in the Z-axis direction, the springs can be less likely to mechanically interfere with adjacent diaphragm-backplate pairs arrayed elsewhere on the X-Y plane of the substrate. This can be advantageous for close packing of acoustic sensors on a substrate in comparison to more conventional perimeter sprung components.

Figure 4:
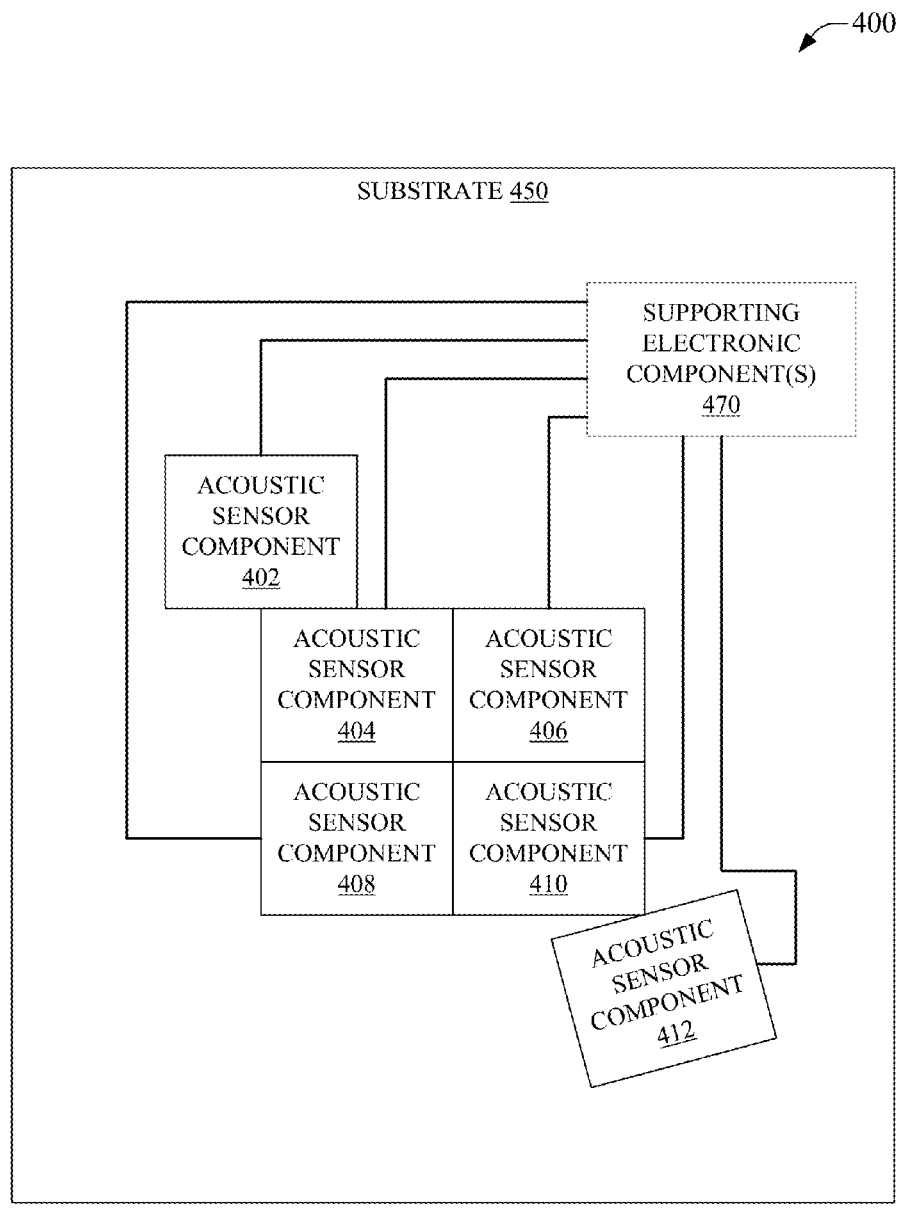
FIG. 4 illustrates a non-limiting example system that enables an array of acoustic sensors having non-perimeter flexible members in accordance with aspects of the subject disclosure.

Of note, the diaphragm and backplate can be electrically connected to other components associated with an acoustic sensor, e.g., supporting electronic component(s) 470 of FIG. 4, etc., despite not being explicitly disclosed herein for the sake of brevity and clarity. As an example, electrical connection 512 in system 500 of FIG. 5, can represent an electrical connection between a diaphragm and/or backplate of component 510 and another component 570. Further, an electrical connection, e.g., 580 of system 500, can be connected to other components, e.g., electrical traces, doped pathways, etc., of substrate 550, to allow connection to components external to system 500. Whereas the particular design of the electrical connections are outside of the scope of the instant disclosure, they will not be further treated herein for the sake of clarity and brevity, although all such electrical connections and configurations are to be considered within the scope of the present disclosure.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages and novel features of the disclosed subject matter will become apparent from the following detailed description when considered in conjunction with the provided drawings.

FIG. 1 is a non-limiting example illustration of a system 100, which that enables an acoustic sensor having a non-perimeter flexible member in accordance with aspects of the subject disclosure. System 100 can include diaphragm component 110 that can be subject to an impinging acoustic pressure. System 100 can further comprise backplate component 120 that, in conjunction with diaphragm component 110, can exhibit a capacitance relative to a gap between backplate component 120 and diaphragm component 110. Where the gap between backplate component 120 and diaphragm component 110 varies, the capacitance will also vary respectively. As such, backplate component 120 and diaphragm component 110 can effect a variable capacitance acoustic sensor where the gap between backplate component 120 and diaphragm component 110 varies as a function of impinging acoustic energy.

System 100 can comprise spacer component 130 to separate backplate component 120 and diaphragm component 110. Generally, the longer spacer component 130 is, the greater the gap between backplate component 120 and diaphragm component 110. Similarly, the shorter spacer component 130 is, generally the smaller the gap between backplate component 120 and diaphragm component 110. Spacer component 130 can be connected to diaphragm component 110. In some embodiments, spacer component 130 can be co-formed with diaphragm component 110. In other embodiments, spacer component 130 can be formed separately from diaphragm component 110 and can then be connected to diaphragm component 110 either directly or via another component (not illustrated for clarity). Of note, spacer component 130 can be linearly or logically disposed between diaphragm component 110 and backplate component 120 either directly or via other components.

System 100 can further comprise flexible component 140. Flexible component 140 can enable displacement of diaphragm component 110 relative to backplate component 120. In an aspect, spacer component 130 can be connected to flexible component 140, such that flexible component 140 and spacer component 130 are disposed, linearly and/or logically, between backplate component 120 and diaphragm component 110. In some embodiments, flexible component 140 can be co-formed with backplate component 120. In other embodiments, flexible component 140 can be formed separately from backplate component 120 and can then be connected to backplate component 120 either directly or via another component (not illustrated for clarity).

As an example, backplate component 120 can comprise flexible component 140. Flexible component 140 can be connected to spacer component 130 which can further be connected to diaphragm component 110. Where spacer component 130 and flexible component 140 are disposed between diaphragm component 110 and backplate component 120, they can result in a gap being created between diaphragm component 110 and backplate component 120. Further, whereas flexible component 140 can enable displacement of diaphragm component 110 relative to backplate component 120, the gap between diaphragm component 110 and backplate component 120 can vary. Where pressure, e.g., an acoustic pressure wave, is applied to diaphragm component 110, this pressure can be communicated to flexible component 140 via spacer component 130. Flexible component 140 can then flex, stretch, deform, etc., which can allow the gap between diaphragm component 110 and backplate component 120 to change. In an embodiment, flexible member 140 can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by diaphragm component 110 and backplate component 120. This change in the electrical characteristic can be correlated with the pressure applied to diaphragm component 110. As such, an electrical measurement can be made for the pressure incident on diaphragm component 110. Pressure can be applied to diaphragm component 110 in the form of acoustic pressure. As such, system 100 can act as an acoustic sensor.

In an embodiment, backplate component 120 can comprise flexible component 140. Flexible component 140 can have a co-planar position in a resting state, e.g., a state where there is no acoustic pressure impinging on diaphragm component 110. In this embodiment, the gap between diaphragm component 110 and backplate component 120 at rest is a function of the dimensions of spacer component 130. As disclosed herein, applying pressure to diaphragm component 110 can cause the gap between diaphragm component 110 and backplate component 120 to change as a function of the characteristics of flexible component 140. Further, where diaphragm component 110 is not substantially rigid, pressure can also result in bending or deflection of diaphragm component 110 that is independent of the characteristics of flexible component 140. Calibration of an acoustic sensor in accord with system 100 can account for differences in rigidity for diaphragm component 110, characteristics of flexible component 140, etc., and such calibration is considered within the scope of the instant disclosure. This can facilitate design considerations that can employ different rigidities for diaphragm component 110, different characteristics for flexible component 140, manufacturing variability, etc.

In an embodiment, flexible component 140 can be out of plane from backplate component 120. Out of plane flexible component 140 geometries can include backplate components comprising out of plane flexible components or out of plane flexible components formed discretely and connected to backplate component 120. Where flexible component 140 has an out of plane geometry, flexible component 140 can contribute to the next gap between diaphragm component 110 and backplate component 120. As an example, where flexible component 140 is out of plane in the positive Z-direction, flexible component 140 can add to the gap between diaphragm component 110 and backplate component 120 for a given spacer component 130 length. In another example, where flexible component 140 is out of plane in the negative Z-direction, flexible component 140 can reduce the gap between diaphragm component 110 and backplate component 120 for the given spacer component 130 length. Of note, out of plane geometries for flexible component 140, such as a negative Z-direction out of plane geometry, can still be considered logically between diaphragm component 110 and backplate component 120 as disclosed herein. In a further aspect, the characteristics of flexible component 140 can be tailored to provide a desired response to impinging pressure at diaphragm component 110, such as a stiffer flexible component 140 allowing less displacement of diaphragm component 110 relative to backplate component 120, a less stiff flexible component 140 allowing greater displacement of diaphragm component 110 relative to backplate component 120, etc.

Figure 2:
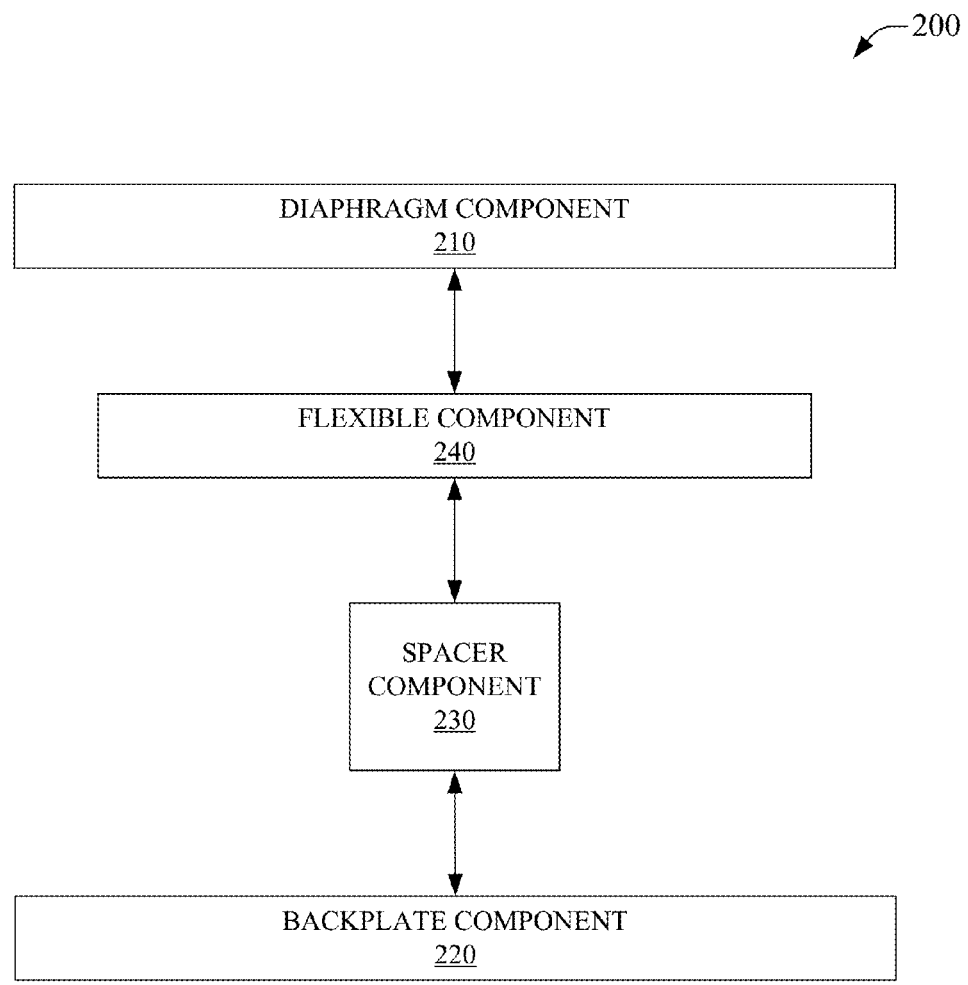
FIG. 2 is a non-limiting example depiction of a system that enables an acoustic sensor having an alternate non-perimeter flexible member in accordance with aspects of the subject disclosure.

FIG. 2 is a non-limiting example depiction of a system 200 that can enable an acoustic sensor having an alternate non-perimeter flexible member in accordance with aspects of the subject disclosure. System 200 can include can include diaphragm component 210 that can be exposed to a pressure front from an acoustic source. System 200 can further comprise backplate component 220 that, in conjunction with diaphragm component 210, can exhibit a capacitance relative to a gap between backplate component 220 and diaphragm component 210. Where the gap between backplate component 220 and diaphragm component 210 varies, the capacitance will also vary respectively. As such, backplate component 220 and diaphragm component 210 can act as a variable capacitance acoustic sensor where the gap between backplate component 220 and diaphragm component 210 varies as a function of pressure applied to diaphragm component 210.

System 200 can comprise spacer component 230 to separate backplate component 220 and diaphragm component 210. Generally, the longer spacer component 230 is, the greater the gap between backplate component 220 and diaphragm component 210. Similarly, the shorter spacer component 230 is, generally the smaller the gap between backplate component 220 and diaphragm component 210. Spacer component 230 can be connected to backplate component 220. In some embodiments, spacer component 230 can be co-formed with backplate component 220. In other embodiments, spacer component 230 can be formed separately from backplate component 220 and can then be connected to backplate component 220 either directly or via another component (not illustrated for clarity). Of note, spacer component 230 can be linearly or logically disposed between diaphragm component 210 and backplate component 220 either directly or via other components.

System 200 can further comprise flexible component 240. Flexible component 240 can enable displacement of diaphragm component 210 relative to backplate component 220. In an aspect, spacer component 230 can be connected to flexible component 240, such that flexible component 240 and spacer component 230 are disposed, linearly and/or logically, between backplate component 220 and diaphragm component 210. In some embodiments, flexible component 240 can be co-formed with diaphragm component 210. In other embodiments, flexible component 240 can be formed separately from diaphragm component 210 and can then be connected to diaphragm component 210 either directly or via another component (not illustrated for clarity).

As an example, diaphragm component 210 can comprise flexible component 240. Flexible component 240 can be connected to spacer component 230 which can further be connected to backplate component 220. Where spacer component 230 and flexible component 240 are disposed between diaphragm component 210 and backplate component 220, they can result in a gap being created between diaphragm component 210 and backplate component 220. Further, whereas flexible component 240 can enable displacement of diaphragm component 210 relative to backplate component 220, the gap between diaphragm component 210 and backplate component 220 can vary. Where pressure, e.g., an acoustic pressure wave, is applied to diaphragm component 210, this pressure can be communicated to flexible component 240 which can be separated from backplate component 220 via spacer component 230. Flexible component 240 can then flex, stretch, deform, etc., which can allow the gap between diaphragm component 210 and backplate component 220 to change. In an embodiment, flexible member 240 can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by diaphragm component 210 and backplate component 220. This change in the electrical characteristic can be correlated with the pressure applied to diaphragm component 210. As such, an electrical measurement can be made for the pressure incident on diaphragm component 210. Pressure can be applied to diaphragm component 210 in the form of acoustic pressure. As such, system 200 can act as an acoustic sensor.

In an embodiment, diaphragm component 210 can comprise flexible component 240. Flexible component 240 can have a co-planar position in a resting state, e.g., a state where there is no acoustic pressure impinging on diaphragm component 210. In this embodiment, the gap between diaphragm component 210 and backplate component 220, at rest, is a function of the dimensions of spacer component 230 because flexible component 240 is co-planar with diaphragm component 210. As disclosed herein, applying pressure to diaphragm component 210 can cause the gap between diaphragm component 210 and backplate component 220 to change as a function of the characteristics of flexible component 240. Further, where diaphragm component 210 is not substantially rigid, pressure can also result in bending or deflection of diaphragm component 210 that is independent of the characteristics of flexible component 240. Calibration of an acoustic sensor in accord with system 200 can account for differences in rigidity for diaphragm component 210, characteristics of flexible component 240, etc., and such calibration is considered within the scope of the instant disclosure. This can facilitate design considerations that can employ different rigidities for diaphragm component 210, different characteristics for flexible component 240, manufacturing variability, etc.

In an embodiment, flexible component 240 can be out of plane from diaphragm component 210. Out of plane flexible component 240 geometries can include diaphragm components comprising out of plane flexible components or out of plane flexible components formed discretely and connected to diaphragm component 210. Where flexible component 240 has an out of plane geometry, flexible component 240 can contribute to the net gap between diaphragm component 210 and backplate component 220. As an example, where flexible component 240 is out of plane in the negative Z-direction, flexible component 240 can add to the gap between diaphragm component 210 and backplate component 220 for a given spacer component 230 length. In another example, where flexible component 240 is out of plane in the positive Z-direction, flexible component 240 can reduce the gap between diaphragm component 210 and backplate component 220 for the given spacer component 230 length. Of note, out of plane geometries for flexible component 240, such as a positive Z-direction out of plane geometry, can still be considered logically between diaphragm component 210 and backplate component 220 as disclosed herein. In a further aspect, the characteristics of flexible component 240 can be tailored to provide a desired response to impinging pressure at diaphragm component 210, such as a stiffer flexible component 240 allowing less displacement of diaphragm component 210 relative to backplate component 220, a less stiff flexible component 240 allowing greater displacement of diaphragm component 210 relative to backplate component 220, etc.

Figure 3:
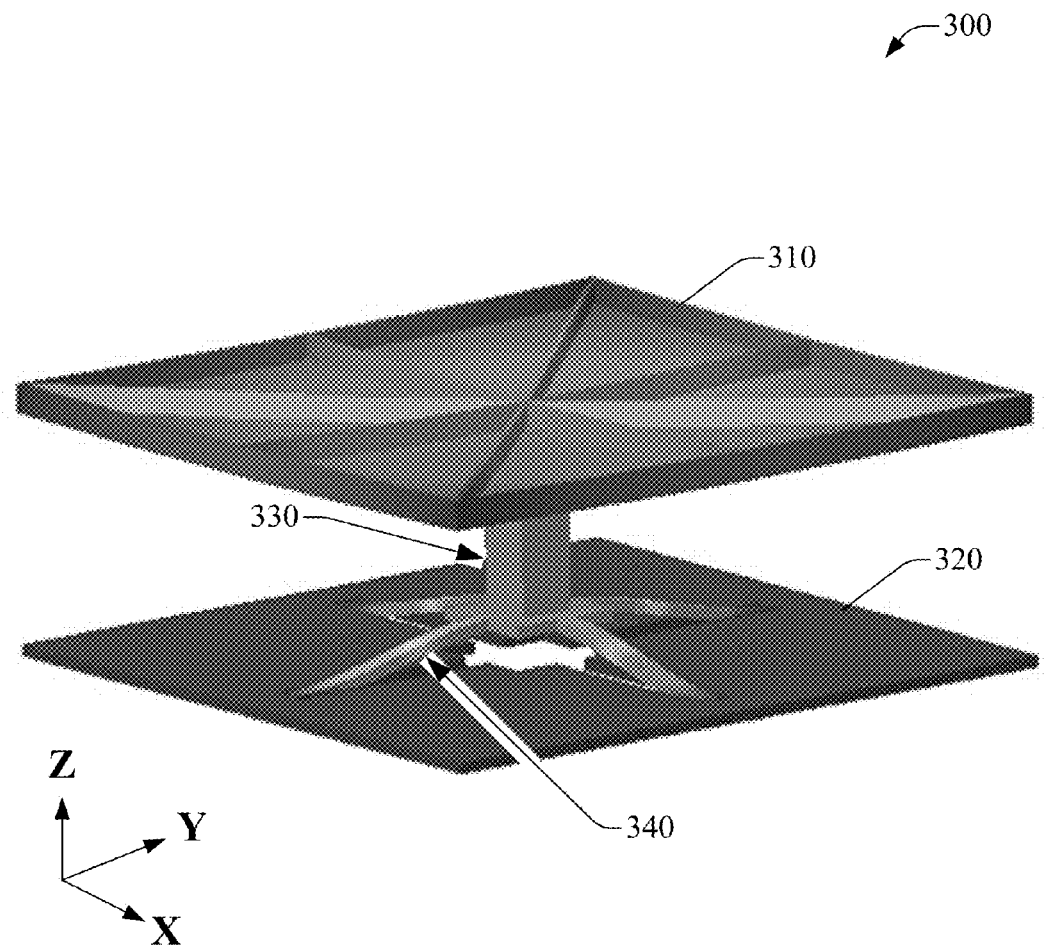
FIG. 3 illustrates a non-limiting example system that enables an acoustic sensor having a non-perimeter flexible member in conjunction with a stiffened diaphragm in accordance with aspects of the subject disclosure.

FIG. 3 illustrates a non-limiting example system 300 that enables an acoustic sensor having a non-perimeter flexible member in conjunction with a stiffened diaphragm in accordance with aspects of the subject disclosure. Of note, the illustration is exaggerated in some proportions to better illustrate various aspects of the instant disclosure. As such, the proportions of the example illustration are not intended to be considered limiting in the context of this disclosure. System 300 can include diaphragm component 310 that can be subject to an impinging acoustic pressure. System 300 can further comprise backplate component 320 that, in conjunction with diaphragm component 310, can exhibit a capacitance relative to a gap between backplate component 320 and diaphragm component 310. Where the gap between backplate component 320 and diaphragm component 310 varies, the capacitance will also vary respectively. As such, backplate component 320 and diaphragm component 310 can function as a variable capacitance acoustic sensor where the gap between backplate component 320 and diaphragm component 310 varies as a function of impinging acoustic energy. In an aspect, diaphragm component 310 can comprise stiffening structures. These stiffening structures can cause diaphragm component 310 to behave more as a rigid member by reducing flexing of diaphragm member 310 as a pressure wave interacts with it. These stiffening structures can have a depth perpendicular to the planar area of diaphragm component 310, e.g., in the Z-axis. In some embodiments, these structures can include ribs, beams, thickened portions, concentric ridges, radial ridges, corrugated diaphragm component cross sections, etc.

System 300 can comprise spacer component 330 to separate backplate component 320 and diaphragm component 310. Generally, the longer spacer component 330 is, the greater the gap between backplate component 320 and diaphragm component 310. Similarly, the shorter spacer component 330 is, generally the smaller the gap between backplate component 320 and diaphragm component 310. Spacer component 330 can be connected to diaphragm component 310. In some embodiments, spacer component 330 can be co-formed with diaphragm component 310. In other embodiments, spacer component 330 can be formed separately from diaphragm component 310 and can then be connected to diaphragm component 310 either directly or via another component (not illustrated for clarity). Of note, spacer component 330 can be linearly and/or logically disposed between diaphragm component 310 and backplate component 320 either directly or via other components.

System 300 can further comprise flexible component 340. Flexible component 340 can enable displacement of diaphragm component 310 relative to backplate component 320. In an aspect, spacer component 330 can be connected to flexible component 340, such that flexible component 340 and spacer component 330 are disposed, linearly and/or logically, between backplate component 320 and diaphragm component 310. In some embodiments, flexible component 340 can be co-formed with backplate component 320. In other embodiments, flexible component 340 can be formed separately from backplate component 320 and can then be connected to backplate component 320 either directly or via another component (not illustrated for clarity).

As an example, backplate component 320 can comprise flexible component 340. Flexible component 340 can be connected to spacer component 330 which can further be connected to diaphragm component 310. Where spacer component 330 and flexible component 340 are disposed between diaphragm component 310 and backplate component 320, they can result in a gap being created between diaphragm component 310 and backplate component 320. Further, whereas flexible component 340 can enable displacement of diaphragm component 310 relative to backplate component 320, the gap between diaphragm component 310 and backplate component 320 can vary. Where pressure, e.g., an acoustic pressure wave, is applied to diaphragm component 310, this pressure can be communicated to flexible component 340 via spacer component 330. Flexible component 340 can then flex, stretch, deform, etc., which can allow the gap between diaphragm component 310 and backplate component 320 to change. In an embodiment, flexible member 340 can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by diaphragm component 310 and backplate component 320. This change in the electrical characteristic can be correlated with the pressure applied to diaphragm component 310. As such, an electrical measurement can be made for the pressure incident on diaphragm component 310. Pressure can be applied to diaphragm component 310 in the form of acoustic pressure. As such, system 300 can act as an acoustic sensor.

In an embodiment, backplate component 320 can comprise flexible component 340. Flexible component 340 can have a co-planar position in a resting state, e.g., a state where there is no acoustic pressure impinging on diaphragm component 310. In FIG. 3, flexible component 340 is illustrated in a non-rest state, e.g., flexed in a positive Z-direction, to be more easily viable as compared to an illustration where flexible component 340 is at rest in a co-planar position with backplate component 320 and, as such is not intended to be limiting as to discussion of co-planar structures in a rest state. In an embodiment, the gap between diaphragm component 310 and backplate component 320 at rest is a function of the dimensions of spacer component 330. As disclosed herein, applying pressure to diaphragm component 310 can cause the gap between diaphragm component 310 and backplate component 320 to change as a function of the characteristics of flexible component 340. Further, where diaphragm component 310 is more or less substantially rigid, pressure can also result in a characteristic bending or deflection of diaphragm component 310 that is independent of the characteristics of flexible component 340. Calibration of an acoustic sensor in accord with system 300 can account for differences in rigidity for diaphragm component 310, characteristics of flexible component 340, etc., and such calibration is considered within the scope of the instant disclosure. This can facilitate design considerations that can employ different rigidities for diaphragm component 310, different characteristics for flexible component 340, manufacturing variability, etc.

In other embodiments, flexible component 340 can be out of plane from backplate component 320 in a rest state. Out of plane flexible component 340 geometries can include backplate components comprising out of plane flexible components or out of plane flexible components formed discretely and connected to backplate component 320. Where flexible component 340 has an out of plane geometry, flexible component 340 can contribute to the next gap between diaphragm component 310 and backplate component 320. As an example, where flexible component 340 is out of plane in the positive Z-direction in a rest state, flexible component 340 can add to the gap between diaphragm component 310 and backplate component 320 for a given spacer component 330 length. In another example, where flexible component 340 is out of plane in the negative Z-direction in a rest state, flexible component 340 can reduce the gap between diaphragm component 310 and backplate component 320 for the given spacer component 330 length. Of note, out of plane geometries for flexible component 340, such as a negative Z-direction out of plane geometry, can still be considered logically between diaphragm component 310 and backplate component 320 as disclosed herein. In a further aspect, the characteristics of flexible component 340 can be tailored to provide a desired response to impinging pressure at diaphragm component 310, such as a stiffer flexible component 340 allowing less displacement of diaphragm component 310 relative to backplate component 320, a less stiff flexible component 340 allowing greater displacement of diaphragm component 310 relative to backplate component 320, etc.

FIG. 4 illustrates a non-limiting example system 400, which can enable an array of acoustic sensors having non-perimeter flexible members in accordance with aspects of the subject disclosure. System 400 can include acoustic sensor components 402 to 412 as illustrated. Acoustic sensor components 402 to 412 can each comprise a diaphragm component, backplate component, flexible component, and a spacer component, substantially in accord with said structures as disclosed elsewhere herein. Further, acoustic sensor components 402 to 412 can be formed on, or connected to, substrate 450. In an embodiment, substrate 450 can comprise a polymer, e.g., FR4, etc., or a ceramic, e.g., alumina, etc. In another embodiment substrate 450 can comprise silicon, e.g., part of a silicon wafer. In other embodiments, substrate 450 can comprise other materials, particularly semiconductors and/or metals, such as germanium, gallium, gold, tin, etc. In some embodiments, a port can be formed through the substrate at one or more of acoustic sensor components 402 to 412 to enable sound pressure to reach acoustic sensor components 402 to 412, respectively, from the side of substrate 450 opposite acoustic sensor components 402 to 412. In other embodiments, a port may not be employed, such as where venting is not at issue, e.g., a low gas pressure environment, in light gas, e.g., hydrogen- or helium-type environments, etc., or where other design choices dictate that a port is less desirable. Where a port is not disposed on a substrate, the port can be disposed in other areas of a package, e.g., on a lid of the package, on a side wall of a package, etc.

System 400 can further comprise supporting electronic component(s) 470. Supporting electronic component(s) 470 can include integrated circuits and/or discrete components. Further, in an embodiment, supporting electronic component(s) 470 can be printed directly on substrate 450. In another embodiment, supporting electronic component(s) 470 can be printed on another substrate that can then be attached, connected, or bonded, to substrate 450. Acoustic sensor components 402 to 412 can be electrically connected to supporting electronic component(s) 470. The electrical connection can be by printed trace, bond wire, doped conductive paths, etc. Typically, each acoustic sensor of acoustic sensor components 402 to 412 can employ an electrical connection for the associated backplate and the associated diaphragm. The electrical connections can also generally be formed in a manner sufficient to conduct expected charge in a manner that is electrically isolated or shielded from other signals, e.g., to reduce cross talk between arrayed acoustic sensors or their respective electrical connections to supporting electronic component(s) 470. Further, although not illustrated for clarity and brevity, further electrical connections between supporting electronic component(s) 470 and other components outside of system 400, e.g., forming a package wherein a package provides electrical connection between bond pads on a chip to a metal lead that can be soldered to a PCB and typically comprises a substrate and a cover, are considered within the scope of the present disclosure to allow access by external devices to measurements made at system 400.

System 400 illustrates that a plurality of acoustic sensors, e.g., acoustic sensor components 402 to 412, can be placed on substrate 450. As such, arrays of acoustic sensors can be formed in a single discrete component. As illustrated, in an embodiment, an array can have a regular rectangular pattern, e.g., acoustic sensor components 404 to 410. In another embodiment, an array can have an irregular pattern, e.g., acoustic sensor components 402 and 412 with respect to one or more of 404 to 410. In an aspect, acoustic sensors can be placed on substrate 450 in a manner that can generally be closer packed than conventional perimeter sprung microphones and/or acoustic sensors. In another aspect, non-rectangular backplate and diaphragm geometries can be employed allowing other array geometries, e.g., honeycomb-type arrays, close packed circle-type arrays, herringbone-type arrays, fullerene geometry-type arrays, etc.

Figure 5A:
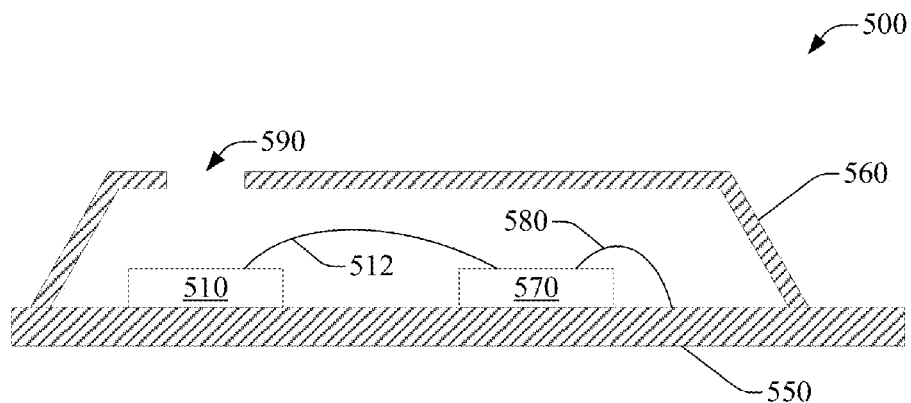
FIG. 5A illustrates a non-limiting example microphone with a MEMS acoustic sensor integrated in a package in accordance with aspects of the subject disclosure.

FIG. 5A illustrates a non-limiting example MEMS acoustic sensor integrated package 500, in accordance with aspects of the subject disclosure. MEMS acoustic sensor integrated package 500 illustrates acoustic sensor component(s) 510. Acoustic sensor component(s) 510 can comprise a diaphragm component, backplate component, flexible component, and a spacer component, substantially in accord with said structures as disclosed elsewhere herein. Further, acoustic sensor component(s) 510 can be formed on, or connected to, a substrate that can comprise a polymer (e.g., FR4, etc.), a ceramic (e.g., alumina, etc.), silicon (e.g., part of a silicon wafer), other materials, particularly semiconductors and/or metals, such as germanium, gallium, gold, tin, etc. In an embodiment, acoustic sensor component(s) 510 can be formed directly on substrate 550. In another embodiment, acoustic sensor component(s) 510 can be formed on another substrate that can then be attached, connected, or bonded, to substrate 550.

Acoustic sensor component(s) 510 can be electrically coupled, via conductor(s) 512, to comprise supporting electronic component(s) 570. Supporting electronic component(s) 570 can include integrated circuits and/or discrete components. In an embodiment, supporting electronic component(s) 570 can be printed directly on substrate 550. In another embodiment, supporting electronic component(s) 570 can be printed on another substrate that can then be attached, connected, or bonded, to substrate 550. Electrical connections can be by printed trace, bond wire, doped conductive paths, etc. Further, supporting electronic component(s) 570 can be eclectically connected, via conductor(s) 580, to pads, vias, traces, doped paths, etc., allowing connection to external components (not illustrated), e.g., package pin-outs.

MEMS acoustic sensor integrated package 500 can further comprise cover 560. A cap or a cover can provide mechanical protection to a structural layer and can form a portion of an enclosure. An enclosure can refer to a fully enclosed volume typically surrounding a MEMS structure and typically formed by the integrated circuit substrate, structural layer, MEMS substrate, and a standoff seal ring. In some embodiments, a port 590 can be formed through cover 560. In some embodiments, port 590 can be proximate to acoustic sensor component(s) 510. Port 590 can enable sound pressure to reach acoustic sensor component(s) 510, or can allow venting of the components of acoustic sensor component(s) 510 to avoid pressure that can alter the response of a diaphragm thereof. In some embodiments, other ports can be included in cover 560 and/or substrate 550.

Figure 5B:
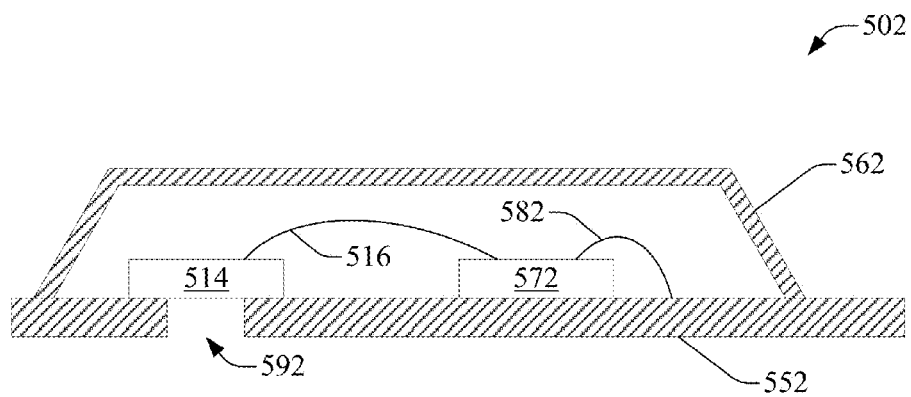
FIG. 5B illustrates another non-limiting example microphone with a MEMS acoustic sensor integrated in a package in accordance with aspects of the subject disclosure.

FIG. 5B illustrates another non-limiting example MEMS acoustic sensor integrated package 502, in accordance with aspects of the subject disclosure. MEMS acoustic sensor integrated package 502 illustrates acoustic sensor component(s) 514. Acoustic sensor component(s) 514 can comprise a diaphragm component, backplate component, flexible component, and a spacer component, substantially in accord with said structures as disclosed elsewhere herein. Further, acoustic sensor component(s) 514 can be formed on, or connected to, a substrate that can comprise a polymer (e.g., FR4, etc.), a ceramic (e.g., alumina, etc.), silicon (e.g., part of a silicon wafer), other materials, particularly semiconductors and/or metals, such as germanium, gallium, gold, tin, etc. In an embodiment, acoustic sensor component(s) 514 can be formed directly on substrate 552. In another embodiment, acoustic sensor component(s) 514 can be formed on another substrate that can then be attached, connected, or bonded, to substrate 552.

Acoustic sensor component(s) 514 can be electrically coupled, via conductor(s) 516, to comprise supporting electronic component(s) 572. Supporting electronic component(s) 572 can include integrated circuits and/or discrete components. In an embodiment, supporting electronic component(s) 572 can be printed directly on substrate 552. In another embodiment, supporting electronic component(s) 572 can be printed on another substrate that can then be attached, connected, or bonded, to substrate 552. Electrical connections can be by printed trace, bond wire, doped conductive paths, etc. Further, supporting electronic component(s) 572 can be eclectically connected, via conductor(s) 582, to pads, vias, traces, doped paths, etc., allowing connection to external components (not illustrated), e.g., package pin-outs.

MEMS acoustic sensor integrated package 502 can further comprise cover 562. A cap or a cover can provide mechanical protection to a structural layer and can form a portion of an enclosure. An enclosure can refer to a fully enclosed volume typically surrounding a MEMS structure and typically formed by the integrated circuit substrate, structural layer, MEMS substrate, and a standoff seal ring. In some embodiments, a port 592 can be formed through substrate 552. In some embodiments, port 592 can be proximate to acoustic sensor component(s) 514. Port 592 can enable sound pressure to reach acoustic sensor component(s) 514, or can allow venting of the components of acoustic sensor component(s) 514 to avoid pressure that can alter the response of a diaphragm thereof. In some embodiments, other ports can be included in cover 562 and/or substrate 552.

In view of the example system(s) described above, example method(s) that can be implemented in accordance with the disclosed subject matter can be better appreciated with reference to flowcharts in FIG. 6-FIG. 10. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described.

Figure 6:
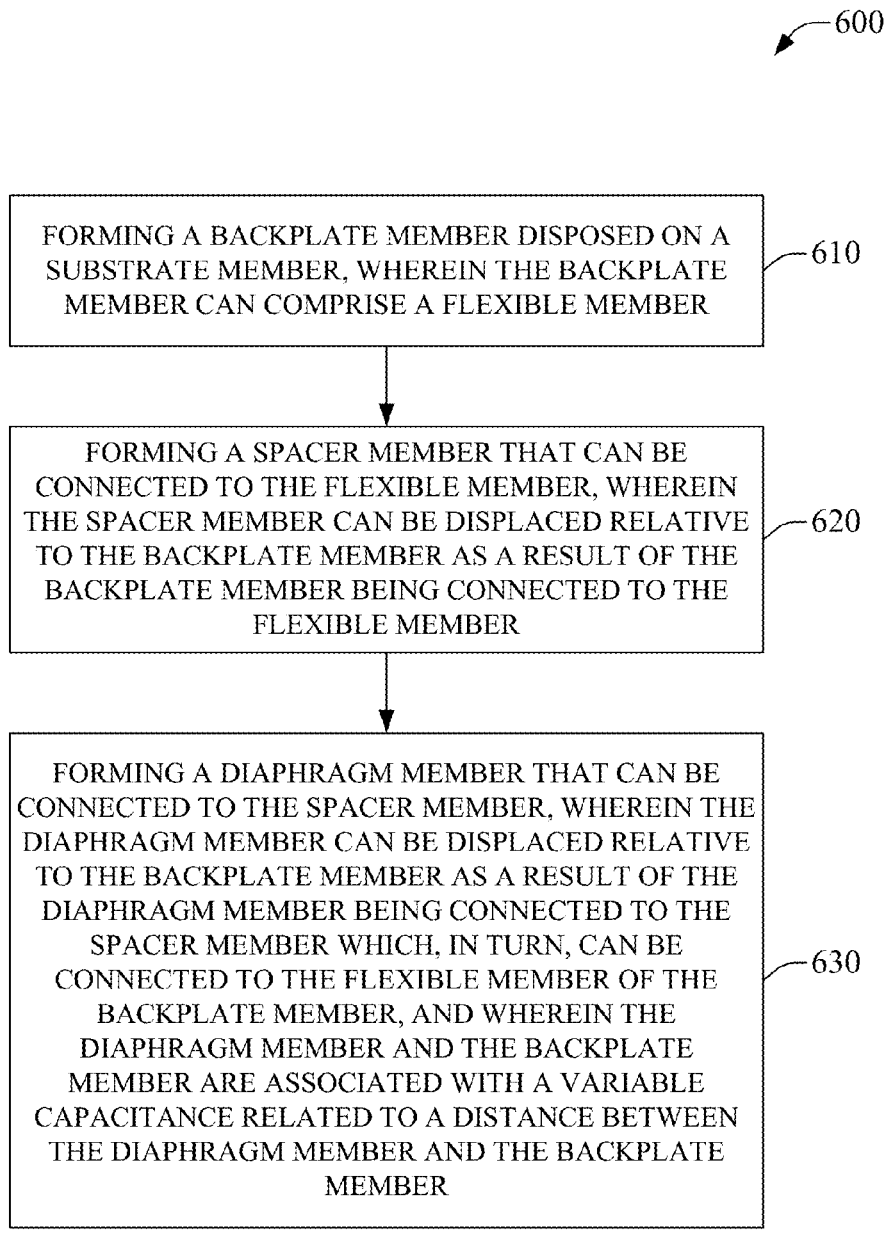
FIG. 6 illustrates a non-limiting example method enabling an acoustic sensor having a non-perimeter flexible member in accordance with aspects of the subject disclosure.

FIG. 6 illustrates a non-limiting example method 600, enabling an acoustic sensor having a non-perimeter flexible member in accordance with aspects of the subject disclosure. At 610, method 600 can include forming a backplane member disposed on a substrate member. The backplane member can comprise a flexible member. Inclusion of the flexible member in the backplate member can indicate that the flexible member is integral to, part of, or is comprised in, the backplate member as compared to the flexible member being a distinct or separate component mated to the backplate member. In some embodiments, the flexible member can be formed separate from the backplate member and then be connected to the backplate member.

At 620, method 600 can comprise forming a spacer member that can be connected to the flexible member. The spacer member can be displaced relative to the backplate member as a result of the backplate member being connected to the flexible member or integral with the flexible member. As such, a spacer member can be disposed either linearly or logically between the backplate member and a diaphragm member. Where the flexible member is co-planar with the backplate, the flexible member can still be considered "between" the backplate and the diaphragm because a path can be traversed from the backplate coplanar through the flexible member before passing out of the flexible member plane to traverse the diaphragm, e.g., as seen in FIG. 3, where a path from backplate 320 can traverse laterally through flexible member 340 before moving perpendicular to backplate 320 to traverse spacer member 330 and diaphragm 310. As such, in FIG. 3, both flexible member 340 and spacer member 330 can be considered to be "between" backplate 320 and diaphragm 310. In some embodiments, the flexible member can be out of plane from the backplate member, allowing formation of the gap between the diaphragm member and backplate member without relying on a spacer member, e.g., the out of plane flexible member acts as a spacer member and the flexible member simultaneously.

At 630, method 600 can comprise forming a diaphragm member that can be connected to the spacer member. At this point method 600 can end. The diaphragm member can be displaced relative to the backplate member as a result of the diaphragm member being connected to the spacer member. Further, the spacer member can be connected to the flexible member of the backplane member. The diaphragm member and the backplate member can be associated with a variable capacitance related to a distance between the diaphragm member and the backplate member.

In an aspect, where the gap between the backplate member and the diaphragm member varies, the capacitance will also vary respectively. As such, the backplate member and the diaphragm member can be a variable capacitance acoustic sensor where the gap between the backplate member and the diaphragm member varies as a function of impinging acoustic energy. The flexible member can then flex, stretch, deform, etc., which can allow the gap between the diaphragm member and the backplate member to change. In an embodiment, the flexible member can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by the diaphragm member and the backplate member. This change in the electrical characteristic can be correlated with pressure applied to the diaphragm member. As such, an electrical measurement can be made for the pressure incident on the diaphragm member. Pressure can be applied to the diaphragm member in the form of acoustic pressure.

Figure 7:
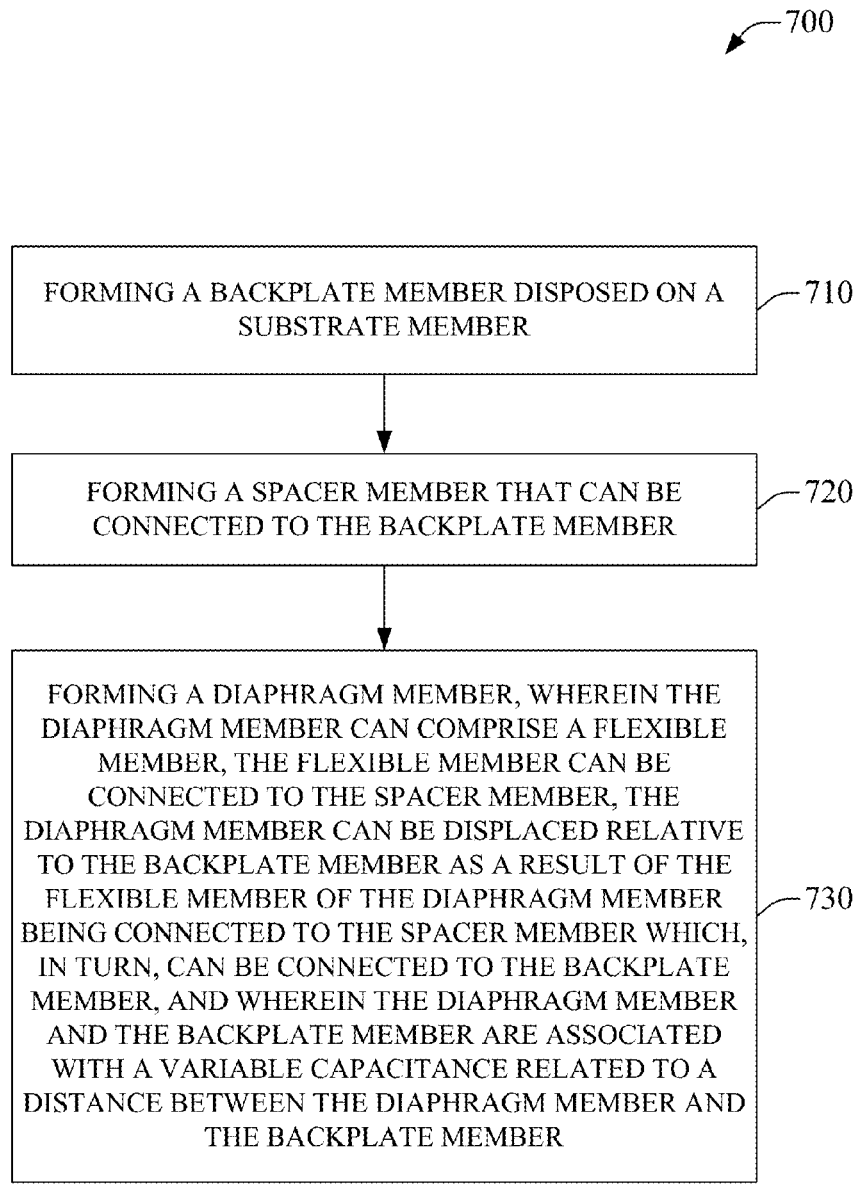
FIG. 7 depicts a non-limiting example method enabling an alternative acoustic sensor having a non-perimeter flexible member in accordance with aspects of the subject disclosure.

FIG. 7 illustrates a non-limiting example method 700, enabling an alternative acoustic sensor having a non-perimeter flexible member in accordance with aspects of the subject disclosure. At 710, method 700 can include forming a backplane member disposed on a substrate member. At 720, method 700 can comprise forming a spacer member. The spacer member can be connected to the backplate member. As such, a spacer member can be disposed either linearly or logically between the backplate member and a diaphragm member.

At 730, method 700 can comprise forming a diaphragm member that can comprise a flexible member. At this point method 700 can end. Inclusion of the flexible member in the diaphragm member can indicate that the flexible member is integral to, part of, or is comprised in, the diaphragm member as compared to the flexible member being a distinct or separate component mated to the diaphragm member. In some embodiments, the flexible member can be formed separate from the diaphragm member and then be connected to the diaphragm member. The flexible member can be connected to the spacer member. The diaphragm member can be displaced relative to the backplate member as a result of the diaphragm member being connected to the flexible member or integral with the flexible member. Where the flexible member is co-planar with the diaphragm member, the flexible member can still be considered "between" the backplate member and the diaphragm member. Further, the diaphragm member can be displaced relative to the backplate member as a result of the diaphragm member being connected to the flexible member which is, in turn, connected to the spacer member connected to the backplate member. The diaphragm member and the backplate member can be associated with a variable capacitance related to a distance between the diaphragm member and the backplate member. In some embodiments, the flexible member can be out of plane from the diaphragm member, allowing formation of the gap between the diaphragm member and backplate member without relying on a spacer member, e.g., the out of plane flexible member acts as both the spacer member and the flexible member simultaneously.

In an aspect, where the gap between the backplate member and the diaphragm member varies, the capacitance will also vary respectively. As such, the backplate member and the diaphragm member can act as a variable capacitance acoustic sensor where the gap between the backplate member and the diaphragm member varies as a function of impinging acoustic energy. The flexible member can then flex, stretch, deform, etc., which can allow the gap between the diaphragm member and the backplate member to change. In an embodiment, the flexible member can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by the diaphragm member and the backplate member. This change in the electrical characteristic can be correlated with pressure applied to the diaphragm member. As such, an electrical measurement can be made for the pressure incident on the diaphragm member. Pressure can be applied to the diaphragm member in the form of acoustic pressure.

Figure 8:
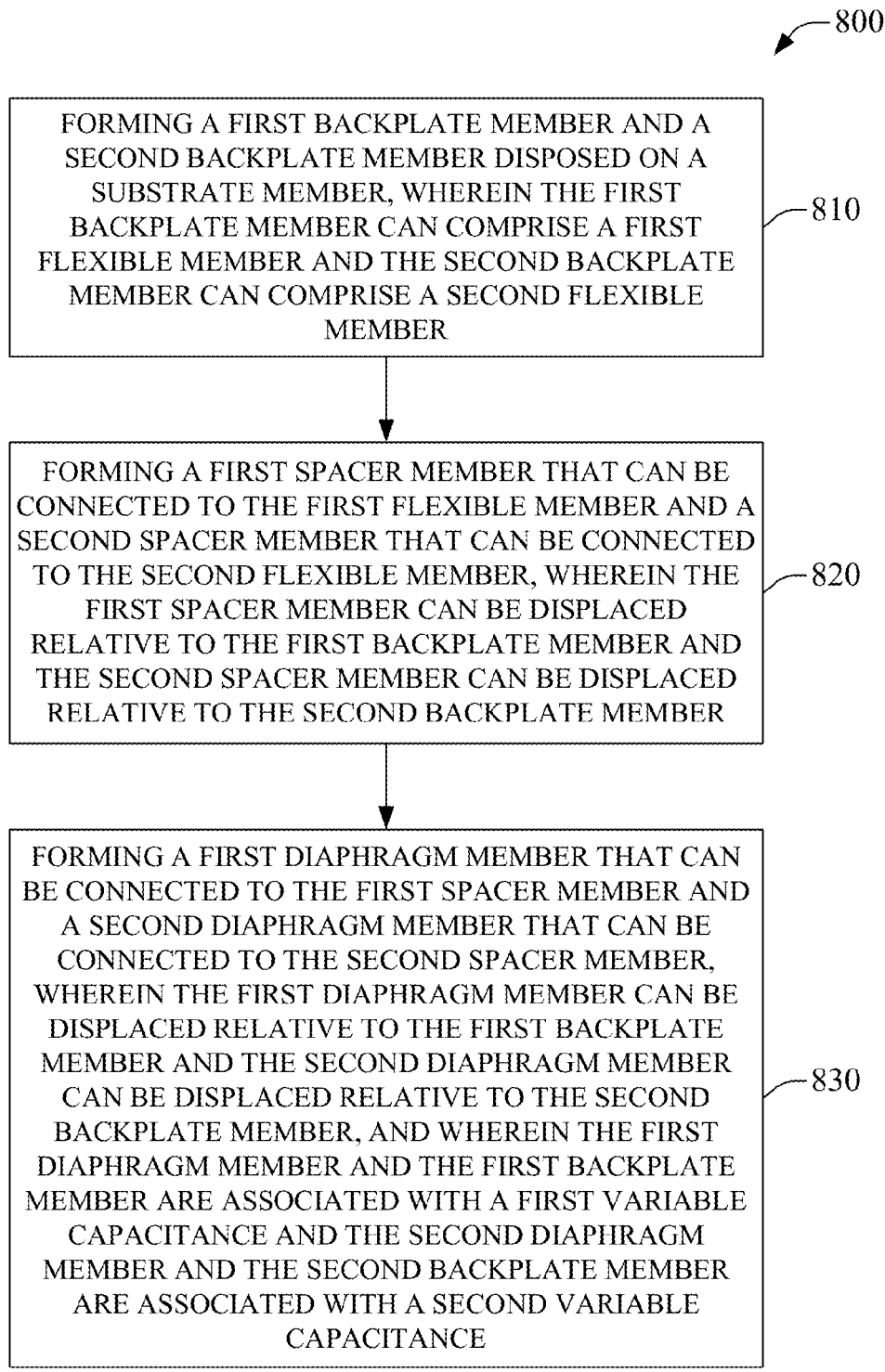
FIG. 8 illustrates a non-limiting example method enabling an array of acoustic sensors having a non-perimeter flexible members in accordance with aspects of the subject disclosure.

FIG. 8 illustrates a non-limiting example method 800, enabling an array of acoustic sensors having non-perimeter flexible members in accordance with aspects of the subject disclosure. At 810, method 800 can include forming a first backplane member disposed on a substrate member and forming a second backplane member disposed on the substrate member. The first backplane member can comprise a first flexible member and the second backplane member can comprise a second flexible member. Inclusion of a flexible member in a backplate member can indicate that the flexible member is integral to, part of, or is comprised in, the backplate member as compared to the flexible member being a distinct or separate component mated to the backplate member. In some embodiments, a flexible member can be formed separate from a backplate member and then be connected to the backplate member.

At 820, method 800 can comprise forming a first spacer member that can be connected to the first flexible member. Further, at 820, a second spacer member can be formed that can be connected to the second flexible member. The first spacer member can be displaced relative to the first backplate member, and the second spacer member can be displaced relative to the second backplate member, as a result of the backplate members being connected to the corresponding flexible members or integral with the corresponding flexible members. As such, a spacer member can be disposed either linearly or logically between a backplate member and a diaphragm member. Where a flexible member is co-planar with a backplate, the flexible member can still be considered "between" the backplate and the diaphragm because a path can be traversed from the backplate coplanar through the flexible member before passing out of the flexible member plane to traverse the diaphragm. In some embodiments, a flexible member can be out of plane from a backplate member, allowing formation of a gap between a diaphragm member and the backplate member without relying on a spacer member, e.g., the out of plane flexible member can act as a spacer member and a flexible member simultaneously.

At 830, method 800 can comprise forming a first diaphragm member that can be connected to the first spacer member and a second diaphragm member that can be connected to the second spacer member. At this point method 800 can end. The first diaphragm member can be displaced relative to the first backplate member, and the second diaphragm member can be displaced relative to the second backplate member, as a result of a diaphragm member being connected to a corresponding spacer member. Further, a spacer member can be connected to a flexible member of a corresponding backplane member. The first diaphragm member and the first backplate member can be associated with a first variable capacitance related to a first distance between the first diaphragm member and the first backplate member. The second diaphragm member and the second backplate member can be associated with a second variable capacitance related to a second distance between the second diaphragm member and the second backplate member.

In an aspect, where a gap between a backplate member and a corresponding diaphragm member varies, a corresponding capacitance will also vary. As such, a backplate member and a corresponding diaphragm member can be a variable capacitance acoustic sensor where the gap between the backplate member and the diaphragm member varies as a function of impinging acoustic energy. The flexible member can then flex, stretch, deform, etc., which can allow the gap between the diaphragm member and the corresponding backplate member to change. In an embodiment, a flexible member can comprise a spiral spring structure, a flat spring structure, a segmented spring structure, a metal spring structure, a polysilicon spring structure, an elastomer spring structure, a silicon structure, a resist structure, etc. A change in a gap can be associated with a change in an electrical characteristic of a variable capacitor formed by a diaphragm member and a corresponding backplate member. This change in the electrical characteristic can be correlated with pressure applied to the corresponding diaphragm member. As such, an electrical measurement can be made for the pressure incident on the corresponding diaphragm member. Pressure can be applied to the corresponding diaphragm member in the form of acoustic pressure.

Formation of multiple acoustic sensors in a package can include arrayed acoustic sensors, e.g., as disclosed with regard to FIG. 4. Sound pressure interaction with each acoustic sensor of a package can be measured and can enable advanced acoustic techniques, e.g., determining sound directionality, etc. As an example, as sound propagates in a medium it can interact with a first sensor at the leading edge of the sound pressure wave. As the pressure wave propagates across a plurality of acoustic sensors, e.g., an acoustic sensor array, the timing of the interactions and the geometry of the sensors can be employed in determining the direction from which the sound originated, was reflected, etc. This can be implemented to determine the direction from which gunfire originates, to facilitate automated adjustment of directional microphone positions, etc.

Figure 9:
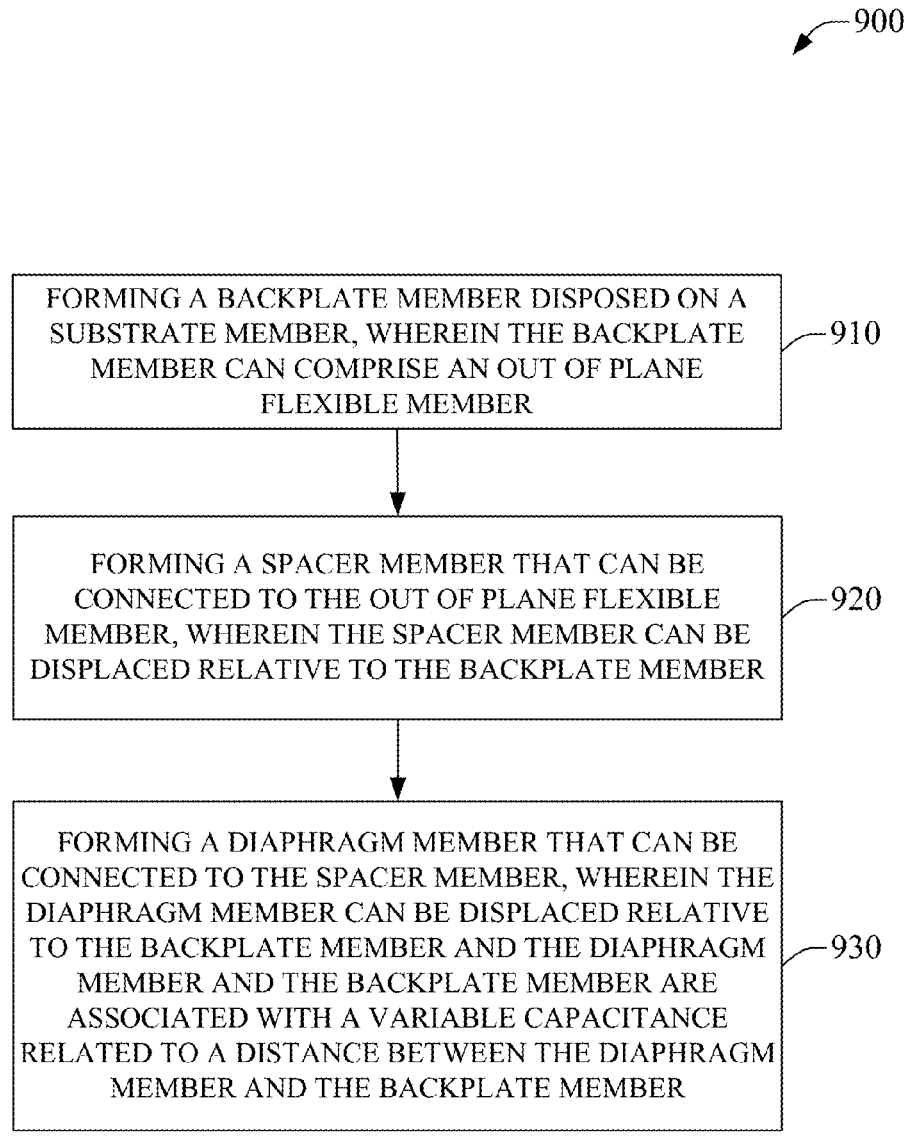
FIG. 9 depicts a non-limiting example method enabling another alternative acoustic sensor having a non-perimeter flexible member in accordance with aspects of the subject disclosure.

FIG. 9 illustrates a non-limiting example method 900, enabling another alternative acoustic sensor having a non-perimeter flexible member in accordance with aspects of the subject disclosure. At 910, method 900 can include forming a backplane member disposed on a substrate member. The backplane member can comprise an out of plane flexible member. Inclusion of the flexible member in the backplate member can indicate that the flexible member is integral to, part of, or is comprised in, the backplate member as compared to the flexible member being a distinct or separate component mated to the backplate member. An out of plane flexible member can be formed such that the flexible member protrudes from the plane of the backplane. As an example, a stair-step type flexible member can be formed by exposing different layers of resist material to patterns that facilitate formation of a step like flexible member, inducing stresses into portions of a flexible member can cause it to have an out of plane orientation in a rest state, etc. In some embodiments, the flexible member can be formed separate from the backplate member and then be connected to the backplate member.

At 920, method 900 can comprise forming a spacer member that can be connected to the flexible member. In some embodiments, the out of plane flexible member can act as both the spacer member and the flexible member. In another embodiment, the out of plane flexible member can reduce the length of the spacer member needed to establish a given gap distance in a rest state. Where a spacer member is formed, the spacer member can be displaced relative to the backplate member as a result of the backplate member being connected to the flexible member or integral with the flexible member. As such, a spacer member can be disposed either linearly or logically between the backplate member and a diaphragm member. In embodiments where the flexible member is out of plane from the backplate member, formation of the gap between the diaphragm member and backplate member can be accomplished without relying on an explicit spacer member, e.g., the out of plane flexible member acts as a spacer member and the flexible member simultaneously.

At 930, method 900 can comprise forming a diaphragm member that can be connected to the spacer member. At this point method 900 can end. The diaphragm member can be displaced relative to the backplate member as a result of the diaphragm member being connected to the spacer member. Further, the spacer member can be connected to the flexible member of the backplane member. The diaphragm member and the backplate member can be associated with a variable capacitance related to a distance between the diaphragm member and the backplate member.

In an aspect, where the gap between the backplate member and the diaphragm member varies, the capacitance will also vary respectively. As such, the backplate member and the diaphragm member can be a variable capacitance acoustic sensor where the gap between the backplate member and the diaphragm member varies as a function of impinging acoustic energy. The flexible member can then flex, stretch, deform, etc., which can allow the gap between the diaphragm member and the backplate member to change. In an embodiment, the flexible member can comprise a spiral spring structure, a flat spring structure, a segmented spring structure, a metal spring structure, a polysilicon spring structure, an elastomer spring structure, a silicon structure, a resist structure, etc. The change in the gap can be associated with a change in an electrical characteristic of the variable capacitor formed by the diaphragm member and the backplate member. This change in the electrical characteristic can be correlated with pressure applied to the diaphragm member. As such, an electrical measurement can be made for the pressure incident on the diaphragm member. Pressure can be applied to the diaphragm member in the form of acoustic pressure.

Figure 10:
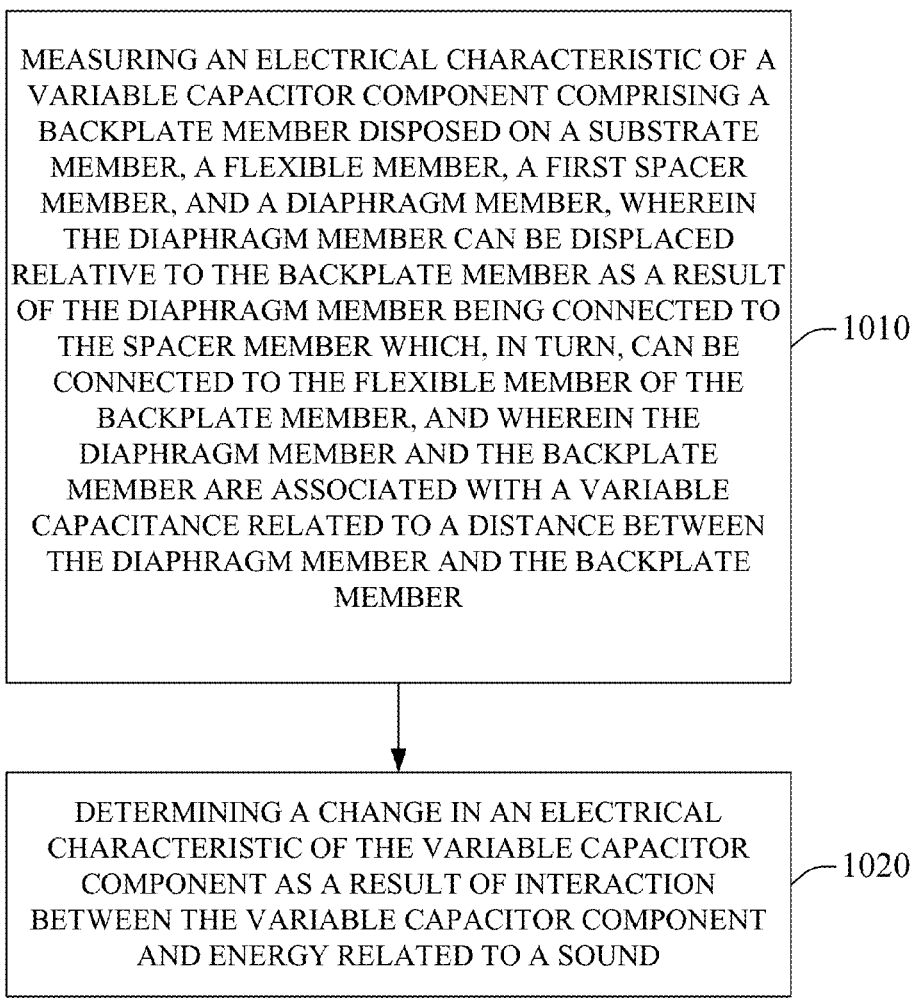
FIG. 10 illustrates a non-limiting example method enabling measurement of acoustic energy via an acoustic sensor having a non-perimeter flexible member in accordance with aspects of the subject disclosure.

FIG. 10 illustrates a non-limiting example method 1000, enabling measurement of acoustic energy via an acoustic sensor having a non-perimeter flexible member in accordance with aspects of the subject disclosure. At 1010, method 1000 can include measuring an electrical characteristic of a variable capacitor component comprising a backplate member, a flexible member, an optional spacer member, and a diaphragm member. In an embodiment, the flexible member can comprise a spiral spring structure, a flat spring structure, a segmented spring structure, a metal spring structure, a polysilicon spring structure, an elastomer spring structure, a silicon structure, a resist structure, etc. The diaphragm member can be displaced relative to the backplate member as a result of the connection between the two via the flexible member and the optional spacer member. A gap between the backplate member and the diaphragm member can vary and the capacitance will vary correspondingly.

At 1020, method 1000 can comprise determining a change in the electrical characteristic of the variable capacitor. At this point method 1000 can end. The electrical characteristic can change as a result of an interaction between the variable capacitor component and energy related to sound. As such, the backplate member and the diaphragm member can be treated as a variable capacitance acoustic sensor where the gap between the backplate member and the diaphragm member varies as a function of impinging acoustic energy. The flexible member can then flex, stretch, deform, etc., which can allow the gap between the diaphragm member and the backplate member to change. The change in the gap can be associated with a change in an electrical characteristic of the variable capacitor formed by the diaphragm member and the backplate member. This change in the electrical characteristic can be correlated with pressure applied to the diaphragm member. As such, an electrical measurement can be made for the pressure incident on the diaphragm member. Pressure can be applied to the diaphragm member in the form of acoustic pressure.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A microelectromechanical system (MEMS) acoustic sensor comprising:
   a diaphragm disposed parallel to a backplate, the disposition effecting a variable capacitance as measured between the diaphragm and the backplate as a function of a change in a distance between the diaphragm and the backplate resulting from an interaction with an impinging pressure wave; and
   a flexible spacer member having a first end and a second end opposite and distal from the first end, wherein the first end of the flexible spacer member is disposed under and adjacent to the diaphragm and wherein the second end of the flexible spacer member is disposed above and adjacent to the backplate, and wherein the flexible spacer member determines the change in the distance between the diaphragm and the backplate.

2. The MEMS acoustic sensor of claim 1, wherein the backplate is integrated with a spring.

3. The MEMS acoustic sensor of claim 1, wherein the diaphragm comprises a connecting structure.

4. The MEMS acoustic sensor of claim 1, wherein the diaphragm is integrated with a spring.

5. The MEMS acoustic sensor of claim 1, wherein the backplate comprises a connecting structure.

6. The MEMS acoustic sensor of claim 1, further comprising a stationary portion comprising the backplate.

7. The MEMS acoustic sensor of claim 6, wherein the stationary portion comprises an aperture.

8. The MEMS acoustic sensor of claim 7, wherein the backplate portion of the stationary portion comprises another aperture.

9. The MEMS acoustic sensor of claim 6, further comprising a cover structure comprising an aperture, the cover structure permanently connected to the stationary portion and disposed to protect the diaphragm.

10. The MEMS acoustic sensor of claim 2, wherein the spring comprises an elongated portion.

11. The MEMS acoustic sensor of claim 10, wherein the elongated portion forms a portion of the spring formed in a serpentine manner.

12. The MEMS acoustic sensor of claim 1, employed in a mobile device.

13. A method of transducing a pressure wave characteristic, comprising:
providing a microelectromechanical system (MEMS) acoustic sensor comprising a diaphragm disposed parallel to a backplate, the diaphragm and backplate forming a variable capacitor facilitating measurement of capacitance as a function of a change in a distance between the diaphragm and the backplate resulting from an interaction with an impinging pressure wave, and a flexible spacer member disposed between the backplate and the diaphragm and having a first end and a second end distal from the first end, wherein the first end of the flexible spacer member is disposed under and adjacent to the diaphragm, and wherein the second end of the flexible spacer member is disposed above and adjacent to the backplate, and the flexible spacer member damps the change in the distance between the diaphragm and the backplate; and measuring a change in capacitance of the variable capacitor resulting from the interaction of the impinging pressure wave.

14. The method of claim 13, wherein the backplate comprises a spring.

15. The method of claim 13, wherein the diaphragm comprises a spring.

16. A method for fabricating a microelectromechanical system (MEMS) acoustic sensor, comprising:
forming a diaphragm disposed parallel to a backplate, the diaphragm and backplate forming a variable capacitor facilitating measurement of capacitance as a function of a change in a distance between the diaphragm and the backplate resulting from an interaction with an impinging pressure wave; and
forming a flexible spacer member disposed between the backplate and the diaphragm and having a first end and a second end distal from the first end, wherein the first end of the flexible spacer member is disposed under and adjacent the diaphragm, and wherein the second end of the flexible spacer member is disposed above and adjacent to the backplate.

17. The method of claim 16, wherein the forming the diaphragm disposed parallel to a backplate comprises forming the backplate comprising a spring.

18. The method of claim 16, wherein the forming the diaphragm disposed parallel to a backplate comprises forming the diaphragm comprising a spring.

19. The method of claim 16, wherein the forming the diaphragm disposed parallel to a backplate comprises forming the backplate comprising the flexible spacer member.

20. The method of claim 16, wherein the forming the diaphragm disposed parallel to a backplate comprises forming the diaphragm comprising the flexible spacer member.

* * * * *